United States Patent [19]

Sichmann et al.

[11] Patent Number: 5,074,984
[45] Date of Patent: Dec. 24, 1991

[54] METHOD FOR COATING POLYMETHYLMETHACRYLATE SUBSTRATE WITH ALUMINUM

[75] Inventors: Eggo Sichmann, Gelnhausen; Thomas Krug, Hanau; Wolf-Eckart Fritsche, Kleinostheim; Martin Pollmann, Erlensee, all of Fed. Rep. of Germany

[73] Assignee: Leybold Aktiengesellschaft, Hanau, Fed. Rep. of Germany

[21] Appl. No.: 449,785

[22] Filed: Dec. 13, 1989

[30] Foreign Application Priority Data

Oct. 12, 1989 [DE] Fed. Rep. of Germany ....... 3934092

[51] Int. Cl.$^5$ ............................................. C23C 14/34
[52] U.S. Cl. .............................. 204/192.14; 204/192.15
[58] Field of Search ..................... 204/192.14, 192.15, 204/298.11, 298.17, 298.16, 298.19

[56] References Cited

U.S. PATENT DOCUMENTS

| | | | |
|---|---|---|---|
| 3,801,368 | 4/1974 | Fusayama et al. | 204/192.15 X |
| 4,101,402 | 7/1978 | Vossen, Jr. et al. | 204/192.14 |
| 4,131,530 | 12/1978 | Blum et al. | 204/192.2 X |
| 4,374,717 | 2/1983 | Drauglis et al. | 204/192.14 |
| 4,434,037 | 2/1984 | Crank | 204/298.11 X |
| 4,572,842 | 2/1986 | Dietrich et al. | 204/298.07 X |
| 4,816,124 | 3/1989 | Manabe et al. | 204/192.14 |

OTHER PUBLICATIONS

The Condensed Chemical Dictionary, 9th Ed., pp. 14 and 466.
Valiev et al., The Kinetics and Mechanism of PMMA Photoetching by UV Radiation, Phys. Chem. Mech. Surfaces, vol. 4(6) (1986) pp. 1776–1794.
Gray, American Institute of Physics Handbook, pp. 7-26 & 7-27.

*Primary Examiner*—Nam X. Nguyen
*Attorney, Agent, or Firm*—Felfe & Lynch

[57] ABSTRACT

In a device for coating a substrate 1 made of polymethylmethacrylate with aluminum by means of a direct current source 10 which is connected to an electrode 5 disposed in an evacuable coating chamber 15a and electrically connected to a target 3 to be sputtered and the sputtered particles are deposited on a substrate 1 and wherein a process gas is introduced into the coating chamber (15, 15a), helium has is introduced as a process gas in order to improve adhesiveness and service life 2.

2 Claims, 1 Drawing Sheet

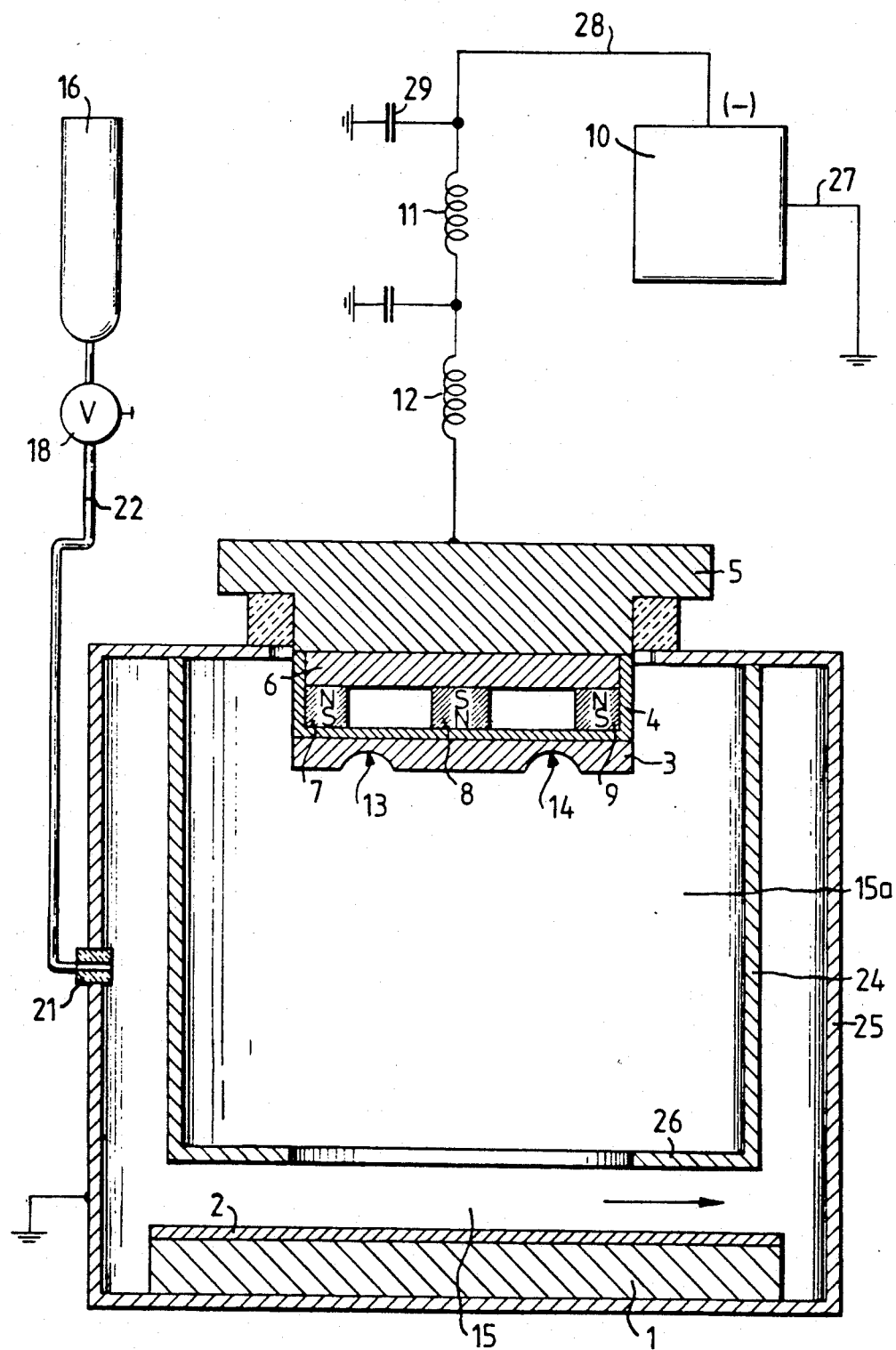

METHOD FOR COATING POLYMETHYLMETHACRYLATE SUBSTRATE WITH ALUMINUM

BACKGROUND OF THE INVENTION

The invention relates to a process and a device for coating a substrate, preferably a polymethylmethacrylate substrate, with metal, preferably aluminum, by means of a direct current source which is connected to an electrode disposed in an evacuable coating chamber and electrically connected to a target to be sputtered and the sputtered particles are deposited on the substrate and wherein a process gas can be introduced into the coating chamber.

In known processes, an aluminum layer is directly sputtered onto the plastic substrate, e.g. on a polycarbonate, without an intermediate or adhesive layer.

It is disadvantageous to this process that the oxidization stability of the aluminum is very limited, i.e storing the substrate over a longer period of time, for example, can cause a corrosion of the layer. Further, it is a disadvantage that it can be applied only to certain selected plastics.

A particular problem arises with the coating of plastics from the group of the polymethylacrylates commercially available as "plexiglass." It turned out that a particular sensitivity of this material to ultraviolet radiation causes the sputtered layer to peel off after a very short while. Together with the noble gases neon, argon, krypton and xenon the plasma does, as a matter of fact, radiate ultraviolet light in a wavelength ranging between 70 and 146 nm.

SUMMARY OF THE INVENTION

It is an object of the present invention to provide a device which is suited to substantially improve the adhesiveness of a sputtered aluminum layer on a plastic substrate without rendering conventional and already available devices and systems unfit for this purpose or involving essential and expensive modifications or changes This object is achieved in accordance with the invention in that helium (He) is introduced into the coating chamber as a process gas

BRIEF DESCRIPTION OF THE DRAWING

The sole FIGURE is a diagrammatic representation of an apparatus suitable for practicing the present invention.

DETAILED DESCRIPTION OF THE PREFERRED EMBODIMENT

The drawing shows a plastic substrate 1 to be provided with a thin, electrically conductive layer 2. A target 3 to be sputtered is located opposite this substrate. An element 4 with a U-like cross section a so-called cathode trough, connects the element to an electrode 5 which rests on a yoke 6. Three permanent magnets 7, 8, 9 are enclosed between this yoke and the trough 4. The polarities of the poles of the three permanent magnets which are directed onto the target 3 alternate such that together with the north pole of the center permanent magnet 8, the respective south poles of the two outer magnets 7, 9 generate an approximately arch-like magnetic field through the target 3. This magnetic field condenses the plasma in front of the target 3 such that it has its greatest density where the magnetic field reaches the maximum of its arch. The ions in the plasma are accelerated by the electric field which is generated by a direct current which in turn is supplied by a direct current source 10. With its negative pole and via two inductors 11, 12, this direct current source 10 is connected to the electrode 5. The electric field stands vertically on the surface of the target 3 and accelerates the positive ions of the plasma in direction of this target 3 disposed in the process chamber 25 and container 24. A more or less great number of atoms or particles is ejected from the target 3, particularly from the areas 13, 14 in which the magnetic fields have their maxima. The sputtered atoms or particles travel in direction toward the substrate 1 which is beneath the diaphragm 26 on the bottom of the container 25 where they are deposited as a thin layer 2.

A process computer to process data and release control commands can be used to control the represented arrangement. The values of the measured partial pressure in the process chamber 15 can be supplied to this process computer, for example. Based on this and other data, the computer can, via valve 18 which is interposed in the supply line 22, control, for example, the helium supply at the container 16 and select the cathode voltage. The process computer is also able to control all other variables, for example the cathode current. Since process computers of this kind are known a description of their design can be omitted.

Using a helium gas as a process or sputtering gas results in a substantial increase in the layer adhesiveness on the polymethylmethacrylate substrate 1.

We claim:

1. Process for coating a polymethylmethacrylate substrate with a metal, comprising placing said polymethylmethacrylate substrate in an evacuable coating chamber containing a target of said metal, said target having a surface to be sputtered and magnetic means for forming an arch-like magnetic field over said surface of said target, said target being connected to an electrode which is connected to a direct current source, evacuating said chamber and introducing helium into said chamber as a process gas to produce a plasma which is condensed over said surface to be sputtered, applying a direct current to said electrode to generate an electric field which accelerates the ions in the plasma toward the surface to be sputtered, thereby sputtering said target and coating said polymethylacrylate substrate with said metal.

2. Process as in claim 1 wherein said metal is aluminum.